United States Patent
Ko et al.

(10) Patent No.: US 8,618,653 B2
(45) Date of Patent: Dec. 31, 2013

(54) INTEGRATED CIRCUIT PACKAGE SYSTEM WITH WAFER SCALE HEAT SLUG

(75) Inventors: WonJun Ko, Sungnam-si (KR); Taeg Ki Lim, Icheon (KR); Sungmin Song, Inchon (KR)

(73) Assignee: Stats Chippac Ltd., Singapore (SG)

( * ) Notice: Subject to any disclaimer, the term of this patent is extended or adjusted under 35 U.S.C. 154(b) by 1139 days.

(21) Appl. No.: 12/022,296

(22) Filed: Jan. 30, 2008

(65) Prior Publication Data
US 2009/0189275 A1 Jul. 30, 2009

(51) Int. Cl.
*H01L 23/10* (2006.01)
*H01L 21/44* (2006.01)

(52) U.S. Cl.
USPC .......... 257/706; 257/713; 257/666; 257/783; 257/784; 257/787; 257/E23.051; 257/E23.101; 438/112; 438/122; 438/124; 438/127; 438/125; 438/617

(58) Field of Classification Search
USPC ......... 257/698, 706, 713, 784, 666, 783, 787, 257/E23.051, E23.101; 438/122–127, 112, 438/617
See application file for complete search history.

(56) References Cited

U.S. PATENT DOCUMENTS

| | | | |
|---|---|---|---|
| 6,472,758 B1 | 10/2002 | Glenn et al. | |
| 6,709,895 B1 * | 3/2004 | Distefano | 438/115 |
| 7,116,000 B2 | 10/2006 | Hall et al. | |
| 7,262,074 B2 | 8/2007 | Hall et al. | |
| 7,274,089 B2 | 9/2007 | Punzalan et al. | |
| 7,332,372 B2 | 2/2008 | Derderian | |
| 7,508,066 B2 * | 3/2009 | Huang et al. | 257/707 |
| 8,183,687 B2 * | 5/2012 | Khan et al. | 257/723 |
| 2002/0180035 A1 * | 12/2002 | Huang et al. | 257/706 |
| 2003/0226253 A1 * | 12/2003 | Mayer | 29/832 |
| 2004/0266068 A1 * | 12/2004 | Matayabas et al. | 438/127 |
| 2005/0095875 A1 * | 5/2005 | Huang et al. | 438/800 |
| 2006/0038266 A1 | 2/2006 | Song et al. | |
| 2006/0103009 A1 | 5/2006 | Lee et al. | |
| 2007/0108590 A1 | 5/2007 | Lee et al. | |
| 2007/0108596 A1 | 5/2007 | Yu et al. | |
| 2007/0109749 A1 | 5/2007 | Kwon | |
| 2007/0111397 A1 * | 5/2007 | Kim et al. | 438/124 |
| 2007/0152308 A1 * | 7/2007 | Ha et al. | 257/666 |
| 2007/0152325 A1 * | 7/2007 | Dani et al. | 257/717 |
| 2007/0190693 A1 | 8/2007 | Lee et al. | |
| 2008/0131999 A1 * | 6/2008 | Takiar et al. | 438/109 |
| 2010/0244024 A1 * | 9/2010 | Do et al. | 257/48 |

* cited by examiner

*Primary Examiner* — Nitin Parekh
(74) *Attorney, Agent, or Firm* — Ishimaru & Associates LLP

(57) ABSTRACT

An integrated circuit package system includes: providing a singulated, layered structure equivalent in size to an integrated circuit die and having an adhesive layer, an electrical insulator layer, and a heat slug; attaching the integrated circuit die to a base; attaching bond wires to a top of the base for electrical connection between the integrated circuit die and the base; attaching the singulated, layered structure to the integrated circuit die wherein the bond wires are surrounded by the adhesive layer; and encapsulating the integrated circuit die and a portion of the heat slug with a molding compound.

20 Claims, 4 Drawing Sheets

INTEGRATED CIRCUIT PACKAGE SYSTEM WITH WAFER SCALE HEAT SLUG

TECHNICAL FIELD

The present invention relates generally to integrated circuit package systems, and more particularly to a system for wafer scale layered structure system.

BACKGROUND ART

In the electronics industry, a continuing objective is to further and further reduce the size of electronic devices while simultaneously increasing performance and speed. Cellular phones, personal data devices, notebook computers, camcorders, and digital cameras are but a few of the consumer products that require and benefit from this ongoing miniaturization of sophisticated electronics.

An integrated circuit die is a small device formed on a silicon wafer, such as a semiconductor wafer. The integrated circuit die usually is made from a semiconductor material such as silicon or gallium arsenide. Such an integrated circuit die is typically cut from the wafer and attached to a substrate or base carrier for redistribution of interconnects. Bond pads on the integrated circuit die are then electrically connected to the leads on the carrier via bond wires. The integrated circuit die and bond wires are encapsulated with a protective material such that a package is formed. The leads encapsulated in the package are redistributed in a network of conductors within the carrier and end in an array of terminal points outside the package.

Recently there has been rapid development in semiconductor technology and, as a result, semiconductors are becoming smaller, circuitry within semiconductors is becoming increasingly dense to provide higher speeds. As the density increases however, higher power is used in these semiconductor components. Higher power results in greater heat generation in such semiconductors. Thus, heat dissipation is becoming more critical as semiconductor technology develops to address the increasing demand for semiconductors having higher power and speed.

Various techniques may be used to remove or dissipate heat generated by a semiconductor. One passive configuration involves a conductive material in thermal contact with the backside of a packaged die. This conductive material is often a slug, a heat spreader, or an integrated heat spreader (IHS). The heat slug may be formed of a suitable thermally conductive material such as copper, aluminum, composites, or other thermally conductive materials.

The heat slug removes the heat from the integrated circuit and reduces the likelihood of the occurrence of hot spots that can have an adverse effect on the performance and reliability of the integrated circuit. This is achieved by using a wafer scale heat slug system in which the heat slug blank of equivalent size to the integrated circuit is attached to the integrated circuit and the integrated circuit is attached to the substrate.

Interconnection technology is an important aspect of the fabrication of electronic components containing semiconductor devices. The type of interconnection scheme, which is used, can vary widely depending on the desired characteristics of the packaging involved. For example, thin wires are typically used as part of the interconnection, and these may be ultrasonically bonded to the bond pad (sometimes referred to herein as "wire bonding") or by the formation of solder balls, which, make a direct connection between the bond pad on the chip and a substrate (as in the flip chip process).

Wire bonding generally begins with attaching a semiconductor chip to the surface of a printed circuit board with an appropriate adhesive such as an epoxy. In wire bonding, bond wires are attached one at a time to each bond pad on the semiconductor chip and extend to a corresponding lead or trace end on the printed circuit board. The bond wires are generally attached through one of three industry-standard wire bonding techniques: ultrasonic bonding, thermo-compression bonding, and thermosonic bonding.

An ongoing problem with the use of wire bonding in packaging occurs during a transfer molding encapsulation process of the semiconductor die in what is known as "wire sweep". Wire sweep results when a wave front of dielectric (commonly a silicon-filled polymer) encapsulation material moving through a mold cavity across the semiconductor die and carrier substrate assembly forces wire bonds to contact adjacent wire bonds and become fixedly molded in such a contacted position after the encapsulation material sets. When wire sweep occurs, a wire bond of an integrated circuit die to a carrier substrate creates a short circuit, which results in a nonfunctional integrated circuit die assembly. Wire bond sweeping may also result in bond wire breakage or disconnection from a bond pad or terminal.

Thus, a need still remains for an improved thermal performance of the integrated circuit that allows consistent placement of the heat slug/spreader, easy attachment of the heat slug by wafer scale method while reducing wire sweep and allowing a free design for the wire bond diagram.

Solutions to these problems have been long sought but prior developments have not taught or suggested any solutions and, thus, solutions to these problems have long eluded those skilled in the art.

DISCLOSURE OF THE INVENTION

The present invention provides a singulated, layered structure equivalent in size to an integrated circuit die and having an adhesive layer, an electrical insulator layer, and a heat slug; attaching the integrated circuit die to a base; attaching bond wires to a top of the base for electrical connection between the integrated circuit die and the base; attaching the singulated, layered structure to the integrated circuit die wherein the bond wires are surrounded by the adhesive layer; and encapsulating the integrated circuit die and a portion of the heat slug with a molding compound.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1A:
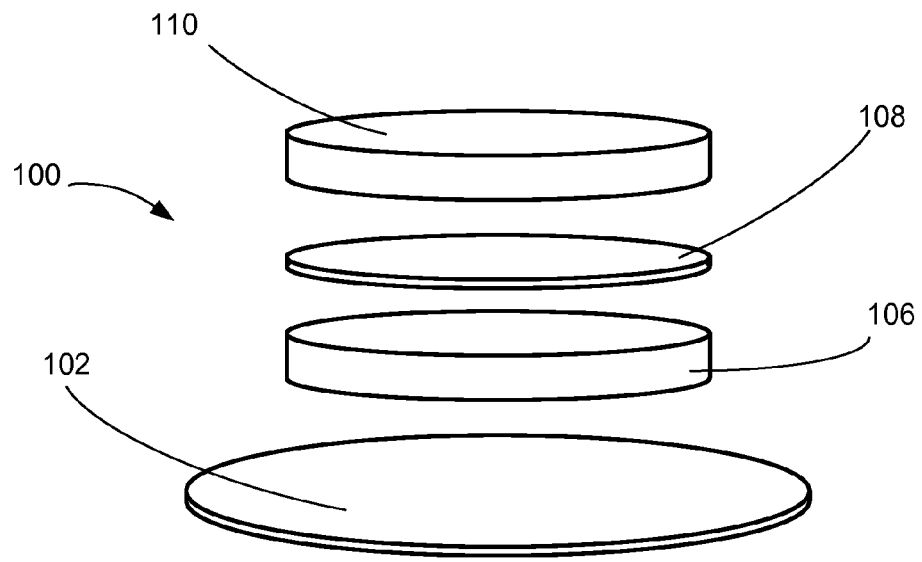
FIGS. 1A and 1B are perspective views of a layered structure system, in a wafer scale mounting process, in an embodiment of the present invention and an assembled perspective view of a wafer scale layered structure system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. Also, where multiple embodiments are disclosed and described, having some features in common, for clarity and ease of illustration, description, and comprehension thereof, similar and like features one to another will ordinarily be described with like reference numerals. The embodiments of the present invention have been numbered strictly as a matter of descriptive convenience and are not intended to be limiting.

For expository purposes, the term "horizontal" as used herein is defined as a plane parallel to the plane or surface of the heat slug, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is a direct contact among elements.

The term "processing" as used herein includes deposition of material or photoresist, patterning, exposure, development, etching, cleaning, and/or removal of the material or photoresist as required in forming a described structure.

The term "system" means a method or device as will be evident from context.

The term "planar" as used herein is defined as a flat surface having a two dimensional characteristic.

The term "coplanar" as used herein is defined as lying or occurring in the same plane.

The term "blank" as used herein is defined as a piece of solid material prepared to be made into something by a further operation.

The term "wire sweep" as used herein is defined as the bend of the bond wires induced when the molding compound flows over the bond wires during the encapsulation process.

The term "wafer scale structure" as used herein is defined as a structure that is about the same planar area as an integrated circuit die from a semiconductor wafer from which the integrated circuit die was cut.

The term "dicing" as used herein is defined as the process by which a material such as silicon wafer is cut by scribing and breaking, or by mechanical sawing using a dicing saw or a laser.

The term "equivalent" as used herein is defined as having about the same dimensions.

Figure 1B:
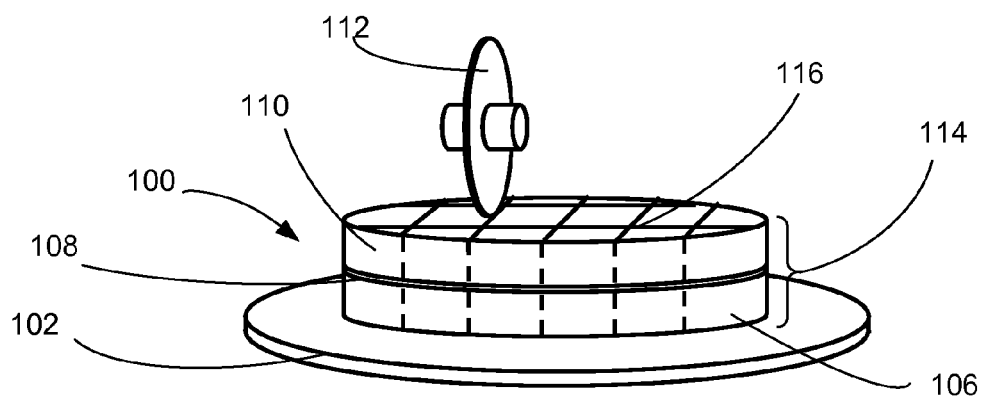

Referring now to FIGS. 1A and 1B, therein are shown perspective views of a layered structure system 100, in a wafer scale mounting process, in an embodiment of the present invention and an assembled perspective view of the layered structure system 100. The layered structure system 100 includes a dicing tape base such as a dicing tape 102, an adhesive layer blank 106, an electrical insulator layer blank 108, and a heat slug blank 110.

The adhesive layer blank 106 is bonded on to the dicing tape 102. The dicing tape 102 may be of a type used with semiconductor wafers and maintains the substantially fixed position of the adhesive layer blank 106 during the dicing with a saw blade 112.

The electrical insulator layer blank 108 is mounted on top of the adhesive layer blank 106 and the heat slug blank 110 is mounted on the top of the electrical insulator layer blank 108 to form a layered structure blank 114.

The heat slug blank 110 is mounted on top of the electrical insulator layer blank 108. The heat slug blank 110 is fabricated from a blank sheet of thermally conductive material, such as aluminum, copper, copper alloy or other thermally conductive material by a process such as stamping, cutting, etc.

A saw guide 116 is pressed in during the stamping of the heat slug blank 110. The thickness of the heat slug blank 110 within the area of the saw guide 116 is smaller than the surrounding area of the heat slug blank 110. The saw guide 116 is used as an aid during the dicing process for a dicing saw alignment and to reduce the dicing saw wear, during the singulation process.

At the completion of the dicing process, the dicing tape 102 is exposed to one of several release processes, such as ultra-violet (UV) release, though it is understood that several other removal processes could be used on the dicing tape 102. In the UV release process the dicing tape 102 is exposed to UV light for a period of time causing the adhesive layer of the dicing tape 102 to release the singulated parts of the layered structure blank 114.

Figure 2:
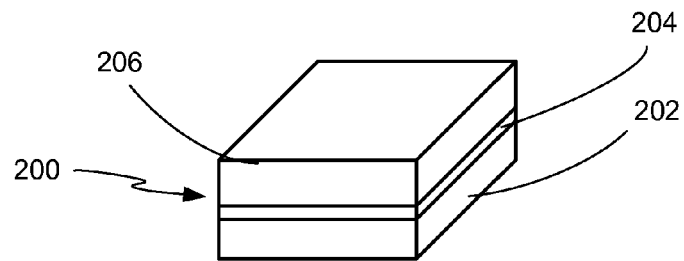
FIG. 2 is a perspective view of the singulated, layered structure in an embodiment of the present invention.

Referring now to FIG. 2, is a perspective view of a singulated, layered structure 200 in an embodiment of the present invention. The singulated, layered structure 200 is a stack of an adhesive layer 202, an electrical insulator layer 204, and a heat slug 206 after the singulation of the layered structure blank 114. The sides of the singulated, layered structure 200 are characterized as being cut using the saw blade 112. Other processes such as laser cutting, water jet cutting, plasma cutting can be used to characterize the sides of the singulated, layered structure 200.

Figure 3:
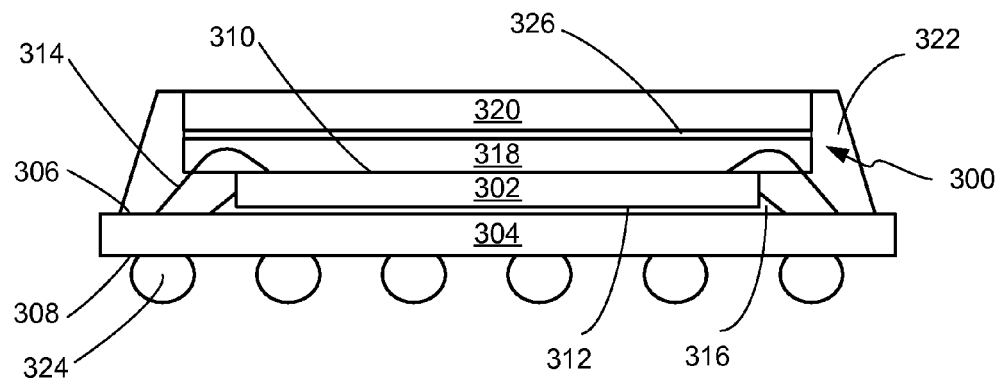
FIG. 3 is a cross-sectional view of an integrated circuit system in a first embodiment of the present invention.

Referring now to FIG. 3, therein is shown a cross-sectional view of an integrated circuit package system 300 in a first embodiment of the present invention. The cross-sectional view depicts an integrated circuit die 302 mounted on a base or a substrate 304, having a substrate top 306 and a substrate bottom 308.

The integrated circuit die 302 has an active surface 310 and a back surface 312 opposite the active surface 310 of the integrated circuit die 302. The active surface 310 is electrically connected to the substrate top 306 using bond wires 314.

A thermal interface material (TIM) 316, such as a die attach adhesive or thermal epoxy, is used to attach the back surface 312 of the integrated circuit die 302 to the substrate top 306. An adhesive layer 318 is used to attach a heat slug 320 to the active surface 310 of the integrated circuit die 302. The adhesive layer 318 is attached directly on the active surface 310 of the integrated circuit die 302.

The adhesive layer 318 is used to partially cover the bond wires 314 to protect them from mold compound sweep. The adhesive layer 318 is pressed down to the integrated circuit die 302 and partially surrounds the bond wires 314 with the adhesive layer 318 coplanar with the back surface 312 of the integrated circuit die 302. The bond wires 314 are in direct contact with and extend through the adhesive layer 318.

The adhesive layer 318 has a low viscosity and, as temperature increases, the viscosity gets lower. Therefore, the adhesive layer 318 can be easily pressed over the bond wires 314 and above and around the integrated circuit die 302 and then cured to harden the adhesive layer 318. At the die bonding stage (temperature about 100° C.) before curing, the viscosity of the adhesive layer 318 can be in a range of 10 to 100 Pa·s.

It has been discovered that the adhesive layer 318 should be a thermally conductive dielectric material. The adhesive layer 318 can be made of a B-stage material that can be hardened after curing and can maintain a predetermined thickness.

It has been discovered that the thickness of the adhesive layer 318 should be at least 20 μm (microns) over the wire loop height of the bond wires 314.

A molding compound 322 is molded around the substrate top 306, the heat slug 320 and the adhesive layer 318. The molding compound 322 encapsulates, protects and establishes structural integrity to the integrated circuit die 302 and the bond wires 314. The bond wires 314 are in direct contact with and extend through the molding compound 322.

Solder balls 324 are mounted on the substrate bottom 308. The solder balls 324 establish electrical interface between the integrated circuit die 302 and the substrate bottom 308 and connection to the next level of system, such as a printed circuit board (not shown).

It has been discovered that an electrical insulator layer 326 is required between the heat slug 320 and the adhesive layer 318 to protect the bond wires 314 from being touched by the heat slug 320 that can be pressed down too far and short circuit the bond wires 314 against the bottom of the integrated circuit die 302.

The electrical insulator layer 326 maintains a clearance between the heat slug 320 and the bond wires 314. The electrical insulator layer 326 may also be an oxidation layer. The electrical insulator layer 326 is vertically between and in direct contact with a surface of the heat slug 320 and a surface of the adhesive layer 318 facing away from the integrated circuit die 302.

Figure 4:
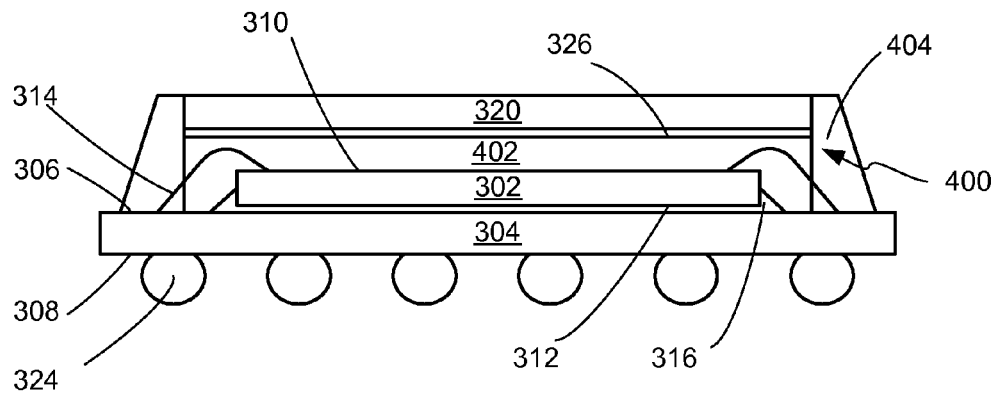
FIG. 4 is a cross-sectional view of an integrated circuit package system in a second embodiment of the present invention.

Referring now to FIG. 4, therein is shown a cross-sectional view of an integrated circuit package system 400 in a second embodiment of the present invention. The cross-sectional view depicts the integrated circuit die 302 mounted on the substrate 304, having the substrate top 306 and the substrate bottom 308.

The integrated circuit die 302 has the active surface 310 and the back surface 312 opposite the active surface 310 of the integrated circuit die 302. The active surface 310 is electrically connected to the substrate top 306 using the bond wires 314.

The TIM 316 is used to attach the back surface 312 of the integrated circuit die 302 to the substrate top 306.

The heat slug 320 is attached to the active surface 310 of the integrated circuit die 302 using an adhesive layer 402.

The adhesive layer 402 is pressed down over the integrated circuit die 302 and partially surrounds the bond wires 314 with the adhesive layer 402 covering the integrated circuit die 302 and about to the top of the substrate top 306.

A molding compound 404 is molded around the substrate top 306 and the sides of the heat slug 320. The molding compound 404 encapsulates and protects the integrated circuit die 302 and the bond wires 314.

The solder balls 324 are attached to the substrate bottom 308 for connection to the next level of the system (not shown).

The electrical insulator layer 326 is required between the heat slug 320 and the adhesive layer 402 to protect the bond wires 314 from being touched by the heat slug 320 that can be pressed down too far and short circuit the bond wires 314 against the bottom of the integrated circuit die 302.

Figure 5:
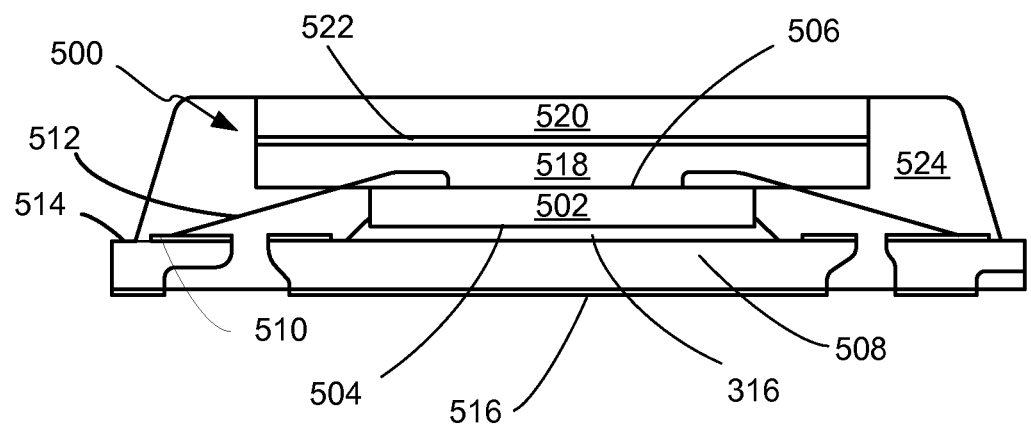
FIG. 5 is a cross-sectional view of an integrated circuit package system, which is a quad flat no-lead (QFN) integrated circuit package, in a third embodiment of the present invention.

Referring now to FIG. 5, therein is shown a cross-sectional view of an integrated circuit package system 500, which is a quad flat no-lead (QFN) integrated circuit package, in a third embodiment of the present invention. An integrated circuit die 502 has a back surface 504 and an active surface 506. The TIM 316 is used to attach the back surface 504 of the integrated circuit die 502 to a die paddle 508. The active surface 506 is electrically connected to bonding pads 510 through bond wires 512.

Lead fingers 514 surround the integrated circuit die 502. The lead fingers 514 are connected to the integrated circuit die 502 with the bond wires 512. The lead fingers 514 are formed of a metal or metal alloy. The lead fingers 514 can be arranged in single or multiple row formats to match multiple levels of stacked die. A solder plating 516 is dispensed onto the die paddle 508 for connection to the next level of the system (not shown).

An adhesive layer 518 is used to attach a heat slug 520 to the integrated circuit die 502. The adhesive layer 518 is used to partially cover the bond wires 512 to protect them from mold compound sweep. The adhesive layer 518 is pressed down to the integrated circuit die 502 and the bond wires 512 and partially surrounds the bond wires 512 with the adhesive layer 518 coplanar with the top of the integrated circuit die 502.

An electrical insulator layer 522 is required between the heat slug 520 and the adhesive layer 518 to protect the bond wires 512 from being touched by the heat slug 520 that can be pressed down too far and short circuit the bond wires 512 against the bottom of the integrated circuit die 502.

A molding compound 524 surrounds the integrated circuit die 502, the bond wires 512, and a portion of the lead fingers 514.

Figure 6:
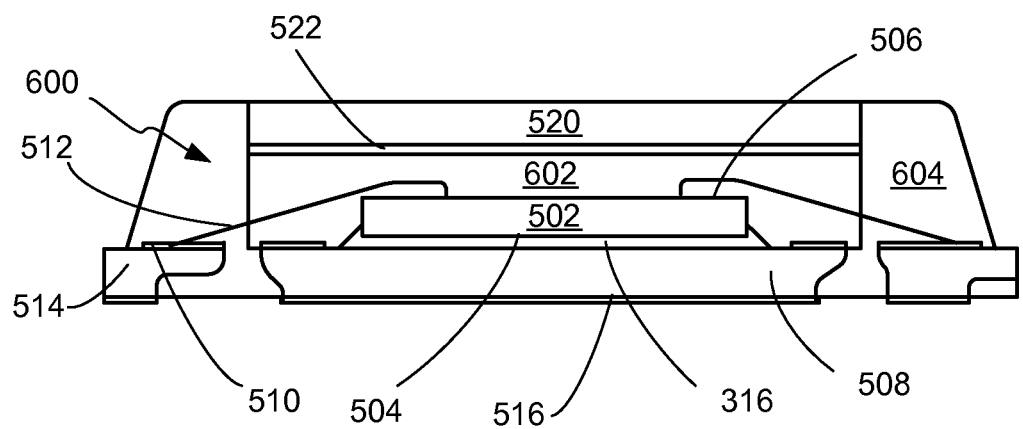
FIG. 6 is a cross-sectional view of an integrated circuit package system, which is a quad flat no-lead (QFN) integrated circuit package, in a fourth embodiment of the present invention.

Referring now to FIG. 6, therein is shown a cross-sectional view of an integrated circuit package system 600, which is a quad flat no-lead (QFN) integrated circuit package, in a fourth embodiment of the present invention. The integrated circuit die 502 has the back surface 504 and the active surface 506. The TIM 316 is used to attach the back surface 504 of the integrated circuit die 502 to the die paddle 508. The active surface 506 is electrically connected to the bonding pads 510 through the bond wires 512.

The lead fingers 514 surround the integrated circuit die 502. The solder plating 516 is dispensed onto the die paddle 508 for connection to the next level of the system (not shown).

An adhesive layer 602 is used to attach the heat slug 520 to the integrated circuit die 502. The adhesive layer 602 is pressed down over the integrated circuit die 502 and partially surrounds the bond wires 512 with the adhesive layer 602 covering the integrated circuit die 502 and about to the top of the die paddle 508.

The electrical insulator layer 522 is required between the heat slug 520 and the adhesive layer 602 to protect the bond wires 512 from being touched by the heat slug 520 that can be pressed down too far and short circuit the bond wires 512 against the bottom of the integrated circuit die 502.

A molding compound 604 partially surrounds the bond wires 512, the heat slug 520, and a portion of the lead fingers 514.

Figure 7:
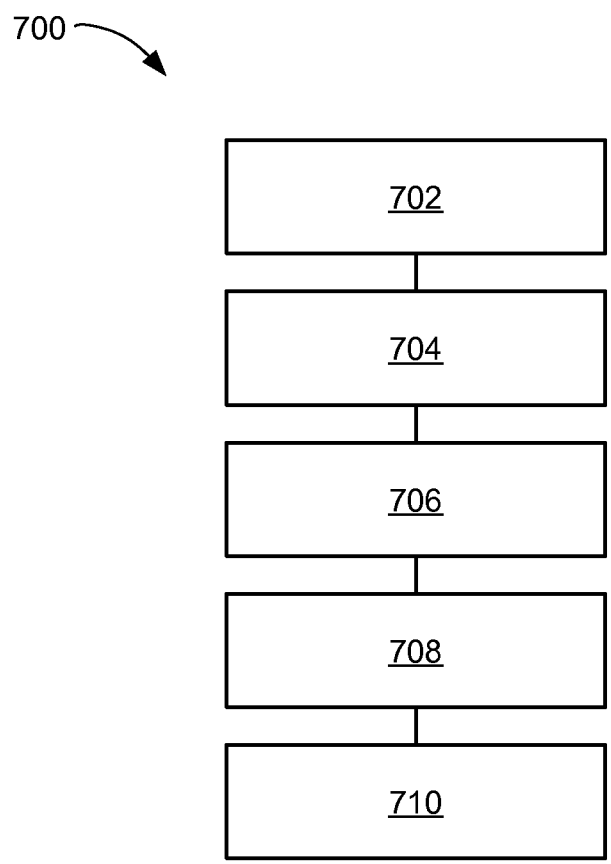
FIG. 7 is a flow chart of an integrated circuit package system for manufacturing an integrated circuit system with a singulated, layered structure in an embodiment of the present invention.

Referring now to FIG. 7, therein is shown a flow chart of an integrated circuit package system 700 for manufacturing an integrated circuit package system 700 with a singulated, layered structure in an embodiment of the present invention.

The integrated circuit package system 700 includes providing a singulated, layered structure equivalent in size to an integrated circuit die and having an adhesive layer, an electrical insulator layer, and a heat slug in a block 702; attaching the integrated circuit die to a base in a block 704; attaching bond wires to a top of the base for electrical connection between the integrated circuit die and the base in a block 706; attaching the singulated, layered structure to the integrated circuit die wherein the bond wires are surrounded by the adhesive layer in a block 708; and encapsulating the integrated circuit die and a portion of the heat slug with a molding compound in a block 710.

In greater detail, a method to fabricate the layered structure system 100 according to various embodiments of the present invention is performed as follows:
1. Dicing the integrated circuit die 302 of FIG. 3 from a semiconductor wafer 104 of FIG. 1A, wherein the sides of the integrated circuit die 302 are characterized by being cut using laser or a saw blade 112 of FIG. 1B.
2. Forming the layered structure blank 114 of FIG. 1B wherein the layered structure blank 114 comprises of the adhesive layer blank 106 of FIG. 1A, the electrical insulator layer blank 108, and the heat slug blank 110 equivalent in size to the semiconductor wafer 104 of FIG. 1A.
3. Dicing the layered structure blank 114 of FIG. 1B to produce a singulated, layered structure 200 of FIG. 2 equivalent in size to the integrated circuit die 302 of FIG. 3, wherein the sides of the layered structure are characterized by being cut using laser or a dicing saw.
4. Attaching the integrated circuit die 302 of FIG. 3 to the substrate top 306;
5. Attaching the bond wires 314 of FIG. 3 to the substrate top 306 (procedure called "wire bonding");
6. Attaching the singulated, layered structure 200 of FIG. 2 to the integrated circuit die 302 of FIG. 3.
7. Encapsulating the integrated circuit die 302 of FIG. 3 with the molding compound 322, wherein the molding compound 322 provides structural integrity and protects the integrated circuit die 302.
8. Mounting the solder balls 324 of FIG. 3 to the substrate bottom 308. The solder balls 324 offer electrical connections between the integrated circuit die 302 and the device to which the integrated circuit die 302 will be attached to (not shown).

It has been discovered that the present invention thus has numerous aspects.

One of the aspects is that the present invention significantly reduces the junction temperature of the integrated circuit die attached to the heat slug. This aspect of the invention is achieved without developing a new tooling or fabrication materials. This invention also extends the useful application of existing integrated circuit manufacturing tools for adhesive layer application and die attach.

Another aspect is that more densely packed circuitry can be packaged without trading off reliability of the integrated circuit die.

Yet another valuable aspect of the present invention is that it supports and services the historical trend of reducing costs, simplifying systems, and increasing performance.

These and other valuable aspects of the present invention consequently further the state of the technology to at least the next level.

Thus, it has been discovered that the wafer scale, layered structure system, the method and apparatus of the present invention furnish valuable and heretofore unknown and unavailable solutions, capabilities, and functional aspects for packaging and operating integrated circuits with reduced junction temperatures. The adhesive is easy to dispense to allow sufficient coverage of the integrated circuit and the bond wires. The electrical insulator layer, mounted between the heat slug and the adhesive layer, is required to avoid electrical short circuit of the bond wires and therefore increasing the reliability of the integrated circuit.

The resulting processes and configurations are straightforward, cost-effective, uncomplicated, highly versatile and effective, can be implemented by adapting known technologies, and are thus readily suited for efficiently and economically manufacturing high power integrated circuit devices that are fully compatible with conventional manufacturing processes and technologies.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims.

All matters hitherto fore set forth herein or shown in the accompanying drawings are to be interpreted in an illustrative and non-limiting sense.

What is claimed is:
1. An integrated circuit package system comprising:
providing a singulated, layered structure equivalent in size to an integrated circuit die and having an electrical insulator layer between and in direct contact with a heat slug and an adhesive layer, the adhesive layer attached directly on the integrated circuit die;
attaching a base to the integrated circuit die;
attaching the singulated, layered structure to the integrated circuit die wherein the bond wires are surrounded by the adhesive layer; and
encapsulating a portion of the heat slug and the integrated circuit die with a molding compound; and
attaching bond wires to a top of the base for an electrical connection between the integrated circuit die and the base, the bond wires in direct contact with and extending through the adhesive layer and the molding compound.

2. The system as claimed in claim 1 wherein attaching the singulated, layered structure includes surrounding the bond wires with the adhesive layer about to an active surface of the integrated circuit die.

3. The system as claimed in claim 1 wherein attaching the singulated, layered structure includes surrounding the bond wires with the adhesive layer about to the base.

4. The system as claimed in claim 1 wherein attaching the base to the integrated circuit die includes attaching the base to the integrated circuit die using a substrate with solder balls or a die paddle with lead fingers.

5. The system as claimed in claim 1 wherein attaching the singulated, layered structure to the integrated circuit die maintains a clearance between the electrical insulator layer and the bond wires.

6. An integrated circuit package system comprising:
providing an integrated circuit die;
forming a layered structure blank wherein the layered structure blank is a stack of an adhesive layer blank, an electrical insulator layer blank, and a heat slug blank;
dicing the layered structure blank into a singulated, layered structure equivalent in size to the integrated circuit die, the singulated, the layered structure having an electrical insulator layer between and in direct contact with a heat slug and an adhesive layer, the adhesive layer attached directly on the integrated circuit die;
attaching a base and the singulated, layered structure to the integrated circuit die;
partially encapsulating a molding compound around the integrated circuit die and the heat slug;
attaching bond wires to a top of the base for an electrical connection between the integrated circuit die and the base, the bond wires in direct contact with and extending through the adhesive layer and the molding compound, and the bond wires protected from the heat slug by the electrical insulator layer; and
attaching solder balls to a bottom of the base.

7. The system as claimed in claim 6 wherein attaching the singulated, layered structure includes surrounding the bond wires with the adhesive layer to be coplanar with a top of the integrated circuit package.

8. The system as claimed in claim 6 wherein attaching the singulated, layered structure includes surrounding the bond wires with the adhesive layer pressed down over the integrated circuit die to the top of the base.

9. The system as claimed in claim 6 wherein attaching the base to the integrated circuit die includes attaching the base to the integrated circuit die using a ball grid array substrate or a die paddle with lead fingers.

10. The system as claimed in claim 6 wherein:
attaching the singulated, layered structure to the integrated circuit die maintains a clearance between the electrical insulator layer and the bond wires; and
attaching the singulated, layered structure to the integrated circuit die maintains a portion of the adhesive layer clear of the bond wires.

11. An integrated circuit package system comprising:
an integrated circuit die;
a base having the integrated circuit die mounted thereon;
a singulated, layered structure, attached to the integrated circuit die, including an electrical insulator layer between and in direct contact with a heat slug and an adhesive layer, the adhesive layer attached directly on the integrated circuit die;
a molding compound partially encapsulating the integrated circuit die and the heat slug; and
bond wires for an electrical connection between the integrated circuit die and a top of the base, the bond wires in direct contact with and extending through the adhesive layer and the molding compound.

12. The system as claimed in claim 11 wherein the singulated, layered structure surrounds the bond wires with the adhesive layer about to a top of the integrated circuit package.

13. The system as claimed in claim 11 wherein the singulated, layered structure partially covers the bond wires with the adhesive layer pressed down over the integrated circuit die to about to the top of the base.

14. The system as claimed in claim 11 wherein the base is a substrate with solder balls or a die paddle with lead fingers.

15. The system as claimed in claim 11 wherein a clearance is maintained between the electrical insulator layer and the bond wires.

16. The system as claimed in claim 11 wherein:
the singulated, layered structure is equivalent in size to the integrated circuit die; and
the base has the solder balls on a bottom thereof.

17. The system as claimed in claim 16 wherein the adhesive layer is coplanar with a back surface of the integrated circuit die.

18. The system as claimed in claim 16 wherein the adhesive layer is to the top of the base.

19. The system as claimed in claim 16 wherein the integrated circuit die is attached to the base wherein the base is a ball grid array substrate or a die paddle with lead fingers.

20. The system as claimed in claim 16 wherein:
the singulated, layered structure maintains a clearance between the electrical insulator layer and the bond wires; and
the singulated, layered structure maintains a portion of the adhesive layer clear of the bond wires.

* * * * *